United States Patent
Ui et al.

(10) Patent No.: US 8,252,193 B2
(45) Date of Patent: Aug. 28, 2012

(54) PLASMA PROCESSING APPARATUS OF SUBSTRATE AND PLASMA PROCESSING METHOD THEREOF

(75) Inventors: Akio Ui, Tokyo (JP); Takashi Ichikawa, Saitama (JP); Naoki Tamaoki, Tokyo (JP); Hisataka Hayashi, Yokohama (JP); Akihiro Kojima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 755 days.

(21) Appl. No.: 12/052,522

(22) Filed: Mar. 20, 2008

(65) Prior Publication Data

US 2008/0237185 A1   Oct. 2, 2008

(30) Foreign Application Priority Data

Mar. 27, 2007   (JP) ............... P2007-082014

(51) Int. Cl.
*G01R 31/00* (2006.01)
*H01L 21/302* (2006.01)
*H01L 21/461* (2006.01)

(52) U.S. Cl. ............ 216/59; 216/67; 216/69; 438/710; 438/711; 438/714; 438/726

(58) Field of Classification Search .......... 216/69; 438/711, 726
See application file for complete search history.

(56) References Cited

U.S. PATENT DOCUMENTS

| | | | |
|---|---|---|---|
| 4,661,203 A * | 4/1987 | Smith et al. | 438/725 |
| 5,701,055 A | 12/1997 | Nagayama et al. | |
| 5,952,037 A | 9/1999 | Nagayama et al. | |
| 6,187,685 B1 * | 2/2001 | Hopkins et al. | 438/710 |
| 7,851,367 B2 * | 12/2010 | Ui | 438/706 |
| 2002/0069971 A1 * | 6/2002 | Kaji et al. | 156/345.46 |
| 2003/0054647 A1 | 3/2003 | Suemasa et al. | |
| 2004/0219797 A1 | 11/2004 | Honda et al. | |
| 2005/0039854 A1 | 2/2005 | Matsuyama et al. | |
| 2005/0082256 A1 * | 4/2005 | Honda et al. | 216/67 |
| 2005/0103441 A1 | 5/2005 | Honda et al. | |
| 2005/0214477 A1 * | 9/2005 | Hanawa et al. | 427/569 |
| 2008/0053818 A1 | 3/2008 | Ui | |
| 2008/0057222 A1 | 3/2008 | Ui | |

FOREIGN PATENT DOCUMENTS

JP   62-111429   5/1987
(Continued)

OTHER PUBLICATIONS

Machine Translation of Japanese Unexamined Patent Application Publication 2002-367962A, Yanagi et al., Pub date Dec. 2002.*

(Continued)

*Primary Examiner* — Shamim Ahmed
*Assistant Examiner* — Bradford Gates
(74) *Attorney, Agent, or Firm* — Finnegan, Henderson, Farabow, Garrett & Dunner, L.L.P.

(57) ABSTRACT

A substrate plasma processing apparatus includes a chamber of which an interior is evacuated under a predetermined vacuum condition; an RF electrode which is disposed in the chamber and configured so as to hold a substrate to be processed on a main surface thereof; an opposing electrode which is disposed opposite to the RF electrode in the chamber; an RF voltage applying device for applying an RF voltage with a predetermined frequency to the RF electrode; and a pulsed voltage applying device for applying a pulsed voltage to the RF electrode so as to be superimposed with the RF voltage and which includes a controller for controlling a timing in application of the pulsed voltage and defining a pause period of the pulsed voltage.

9 Claims, 9 Drawing Sheets

(a)

(b)

FOREIGN PATENT DOCUMENTS

| | | |
|---|---|---|
| JP | 07-074159 | 3/1995 |
| JP | 9-326383 | 12/1997 |
| JP | 2000-156370 | 6/2000 |
| JP | 2002-367962 | 12/2002 |
| JP | 2003-234331 | 8/2003 |
| JP | 2005-307349 | 11/2005 |
| JP | 2006-148156 | 6/2006 |
| JP | 2006-237012 | 9/2006 |
| WO | WO 00/26956 | 5/2000 |

OTHER PUBLICATIONS

The First Office Action issued by the State Intellectual Property Office of the People's Republic of China on Nov. 12, 2010, and English-language translation thereof.

Wang, et al., "Control of ion energy distribution at substrates during plasma processing" Journal of Applied Physics, vol. 88, No. 2, pp. 643-646, (Jul. 2000).

Chen, et al., "Fluid modeling of electron heating in low-pressure, high-frequency capacitively coupled plasma discharges", Journal of Applied Physics, vol. 96, No. 11, pp. 6073-6081, (Dec. 1, 2004).

Notice of Office Action issued by the Korean Intellectual Property Office on Aug. 27, 2009, for Korean Application No. 2007-0122131, and English-language translation thereof.

Jeong, Master of Engineering Thesis, Graduate School of Pusan National University Press (Feb. 28, 1998), pp. cover page, 13-18 and 25-35.

* cited by examiner

PLASMA PROCESSING APPARATUS OF SUBSTRATE AND PLASMA PROCESSING METHOD THEREOF

CROSS-REFERENCE TO RELATED APPLICATIONS

This application is based upon and claims the benefit of priority from the prior Japanese Patent Application No. 2007-082014, filed on Mar. 27, 2007; the entire contents of which are incorporated herein by reference.

BACKGROUND OF THE INVENTION

1. Field of the Invention

The present invention relates to a so-called parallel plate type plasma processing apparatus configured such that the RP electrode is disposed opposite to the opposing electrode and a substrate positioned on the RF electrode is processed by means of plasma which is generated between the RF electrode and the opposing electrode, and to a plasma processing method using the plasma processing apparatus.

2. Description of the Related Art

In the wiring for a substrate such as a semiconductor wafer, it is required that the fine processing is carried out for the substrate before the wiring, and conventionally, in this point of view, a processing apparatus utilizing plasma is often employed for the fine processing.

In the conventional plasma processing apparatus, the high frequency (RF) electrode is disposed opposite to the opposing electrode in the vacuum chamber of which the interior is evacuated in vacuum condition. The substrate to be processed is held on the main surface of the RF electrode which is opposite to the opposing electrode so that the conventional plasma processing apparatus can constitute a parallel plate type plasma processing apparatus. A processing gas to generate the plasma and thus, process the substrate is introduced into the chamber through a gas conduit under a predetermined pressure by vacuum-evacuating the chamber with a vacuum pump through an exhaust line.

Then, a predetermined RF voltage is applied to the RF electrode from a commercial RF power source to generate a high frequency wave of 13.56 MHz so that the intended plasma can be generated between the RF electrode and the opposing electrode.

In this case, since the RF electrode (substrate) is charged negatively so as to be self-biased negatively (the amplitude of the electric potential: Vdc), positive ions are incident onto the substrate at high velocity by means of the negative self-bias of Vdc. As a result, the surface reaction of the substrate is induced by utilizing the substrate incident energy of the positive ions, thereby conducting an intended plasma substrate processing such as reactive ion etching (RIE), CVD (Chemical vapor Deposition), sputtering, ion implantation. Particularly, in view of the processing for the substrate, the RIE can be mainly employed as the plasma substrate processing. Therefore, the RIE processing will be mainly described hereinafter.

In the above-described plasma processing apparatus, since the Vdc (the average substrate incident energy of the positive ions) is increased as the RF power is increased, the RF power is controlled so as to adjust the Vdc for the appropriate processing rate and the shape-forming processing. The Vdc (corresponding to the average substrate incident energy of ions) can be adjusted by controlling the pressure in the chamber and the shape of the RF electrode and/or the opposing electrode.

In the above-described plasma processing apparatus, the ion energy in the plasma generated in the chamber is divided into a lower energy side peak and a higher energy side peak so that the energy difference ($\Delta E$) between the peaks becomes within a range of several ten (eV) to several hundred (eV). Therefore, even though the Vdc is adjusted appropriately, some of the ions incident onto the substrate are belonged to the higher energy range and the other of the ions incident onto the substrate are belonged to the lower energy range so that the ions with the higher energy coexist with the ions with the lower energy.

In the plasma substrate processing such as the RIE, in this point of view, the processing shape of the substrate may be deteriorated because some corners of the substrate are flawed by the ions with the higher energy. Moreover, if the ions with the lower energy are employed, the substrate processing may not be conducted because the ion energy becomes below the surface reaction threshold energy or the processing shape of the substrate may be also deteriorated due to the reduction in the processing anisotropy which is originated from that the incident angle range of the ions are enlarged because the thermal velocity of each ion is different from another one.

Recently, semiconductor devices are much downsized so that the films or complex films composing the semiconductor devices are finely processed. Therefore, the processing technique such as the RIE is required to be finely controlled by narrowing the ion energy range (realizing a smaller $\Delta E$) and controlling the average substrate incident energy (Vdc) appropriately.

In order to narrow the ion energy range, it is considered that the intended plasma is generated by developing the frequency of the high frequency wave (refer to Reference 1) or by utilizing a pulsed wave (refer to Reference 2).

The plasma generation can be mainly classified as inductive coupling type plasma generation and capacity coupling type plasma generation. In view of the fine control for the processing shape, it is effective that the plasma volume is decreased so that the plasma retention time can be shortened, thereby reducing the byproduct reaction. As a result, the capacity coupling plasma generation is effective for the fine control for the processing shape in comparison with the inductive coupling plasma generation because the capacity coupling plasma generation can generate only a plasma with a smaller volume than the inductive coupling plasma generation.

It is also considered that two high frequency waves with the respective different frequencies are applied to the RF electrode so that the plasma density can be controlled by the high frequency wave with a higher frequency of e.g., 100 MHz and the Vdc can be controlled by the high frequency wave with a lower frequency of e.g., 3 MHz (refer to Reference 3). In this case, the plasma density and the Vdc can be finely controlled. Then, two sets of high frequency power sources and matching boxes are prepared for the high frequency waves with the higher frequency and the lower frequency, respectively, so that the high frequency wave with the higher frequency can be superimposed with the high frequency wave with the lower frequency.

In view of the cleaning process and the processing stability, it is desired that the opposing electrode is electrically grounded. If the RF voltage is applied to the opposing electrode, the opposing electrode may be eroded due to the self bias of Vdc applied to the opposing electrode, thereby creating some dusts and render the processing condition unstable. In this point of view, as described above, the two high frequency waves are applied to the RF electrode under the superimposing condition.

[Reference 1] JP-A 2003-234331 (KOKAI)
[Reference 2] G. Chen, L. L. Raja, J. Appl. Phys. 96, p. 6073 (2004)
[Reference 3] J. Appl. Phys. Vol. 88, No. 2, p. 643 (2000)

Such a high frequency technique as examining for ion energy range narrowing is effective for the narrowing of the energy difference ΔE because ions can not follow the electric field from the high frequency wave, but not effective for the enhancement of the Vdc because the absolute value of the Vdc becomes small. For example, if a high frequency wave with a frequency of 100 MHz and an electric power of 2.5 KW is employed (under the condition that the diameter of the susceptor is set to 300 mm, and the pressure in the chamber is set to 50 mTorr using Ar gas), the absolute value of the Vdc is lowered than the Vdc threshold value (about 70 eV) of oxide film or nitride film. Therefore, even though the oxide film and the nitride film is plasma-processed under the condition that the Vdc is lowered than the threshold value, the oxide film and the nitride film can be processed at an extremely processing rate, which can not be practically employed.

On the other hand, if the average substrate incident energy of the positive ions (Vdc) is increased by increasing the RF power, the energy difference ΔE can not be reduced because the Vdc is proportion to the energy difference ΔE during the control of the average substrate incident energy (Vdc) with the RF power. Moreover, the RF power of about 7 KW is required so as to realize the Vdc of 100 V at 100 MHz, which becomes difficult because it is difficult to bring out such a large RF power from a commercially available RF power source with a maximum power within a range of 5 to 10 KW. As a result, the high frequency technique can be applied for such a plasma processing as requiring a lower surface reaction threshold energy, but may not be applied for such a plasma processing as requiring a higher surface reaction threshold energy (70 eV or over) because it is difficult to control the Vdc commensurate with the plasma processing.

In the use of the two high frequency superimposed waves, since the energy difference ΔE is enlarged because the ion energy in the plasma is divided into the lower energy side peak and the higher energy side peak, the energy difference ΔE can not be narrowed.

In the use of the pulsed wave technique, since the ion energy in the plasma is directly controlled by means of the periodically DC voltage, it is advantageous for the ion energy range narrowing and the ion energy control. In this technique, however, since the plasma may be rendered unstable because the applying voltage is remarkably decreased and the plasma density is decreased at DC voltage off-state, and the large current is generated in the plasma when the DC voltage is also applied. Particularly, when an insulator formed on the substrate is plasma-processed, the surface electric charge on the insulator can not be discharged effectively during one period of the DC pulse so that the plasma is rendered unstable and thus, diminished. Moreover, since the large current is generated intermittently in the plasma, the device under fabrication may be electrically damaged, so that a stable parallel plate type pulsed plasma can not be generated.

BRIEF SUMMARY OF THE INVENTION

It is an object of the present invention, in view of the above-described problems, to provide a parallel plate type substrate plasma processing apparatus wherein the RF electrode is disposed opposite to the opposing electrode in a vacuum chamber so as to generate a plasma with an energy suitable for the substrate processing and a smaller ion energy range enough to process the substrate finely. It is an object of the present invention to provide a substrate plasma processing method utilizing the substrate plasma processing apparatus.

In order to achieve the above object, an aspect of the present invention relates to a substrate plasma processing apparatus, including: a chamber of which an interior is evacuated under a predetermined vacuum condition; an RF electrode which is disposed in the chamber and configured so as to hold a substrate to be processed on a main surface thereof; an opposing electrode which is disposed opposite to the RF electrode in the chamber; an RF voltage applying device for applying an RF voltage with a predetermined frequency to the RF electrode; and a pulsed voltage applying device for applying a pulsed voltage to the RF electrode so as to be superimposed with the RF voltage and which includes a controller for controlling a timing in application of the pulsed voltage and defining a pause period of the pulsed voltage.

Another aspect of the present invention relates to a plasma processing method of substrate, including: holding a substrate to be processed on a main surface of an RF electrode which is disposed opposite to an opposing electrode in a chamber of which an interior is evacuated under a predetermined vacuum condition; applying an RF voltage with a predetermined frequency to the RF electrode; applying a pulsed voltage to the RF electrode so as to be superimposed with the RF voltage; and controlling a timing in application of the pulsed voltage and defining a pause period of the pulsed voltage.

In the aspects of the present invention, the pulsed voltage is applied to the RF electrode in addition to the RF voltage. In this case, the pulsed voltage is superimposed with the RF voltage. Therefore, if the pulse width t1, the period t2, the voltage value $V_{pulse}$ of the pulsed voltage and the like are varied, the lower energy side peak can be shifted in an energy range smaller enough not to affect the substrate processing than the energy range of the higher energy side peak or can be in the vicinity of the higher energy side peak.

In the former case, if the energy value of the higher energy side peak is controlled appropriately, the substrate processing can be conducted only by using the ions within the higher energy range peak. That is, if the energy value of the higher energy side peak is optimized and the inherent narrowed energy range characteristic is utilized, the substrate processing can be conducted finely.

In addition, since the pulsed voltage is applied not continuously by defining a pause period, the electric charge on a portion of the substrate, particularly, the positively electric charge on the bottom of the trench of the substrate under processing can be reduced. Therefore, the deterioration of the shape of the portion of the substrate under processing, which is originated from that the incident ions are deflected by the coulomb force due to the electric charge and are not introduced perpendicularly onto the portion under processing, can not be reduced so that the intended substrate can be processed finely. Moreover, the dielectric breakdown of the portion of the substrate under processing, which is originated from the electric charge on the portion of the substrate, can be reduced (First processing method).

In the latter case, the lower energy side peak and the higher energy side peak can be shifted in the vicinity of one another so as to be combined with one another, thereby forming narrow energy band. As a result, if the energy range of the combined energy peak, and the vicinity between the lower energy side peak and the higher, i.e., the narrowing degree of the combined energy peak are optimized, the substrate processing can be conducted finely by using the ions within the one combined energy peak.

Moreover, since the pulsed voltage is applied not continuously by defining a pause period, the electric charge on a portion of the substrate, particularly, the positively electric charge on the bottom of the trench of the substrate under processing can be reduced. Therefore, the deterioration of the shape of the portion of the substrate under processing, which is originated from that the incident ions are deflected by the coulomb force due to the electric charge and are not introduced perpendicularly onto the portion under processing, can not be reduced so that the intended substrate can be processed finely. Moreover, the dielectric breakdown of the portion of the substrate under processing, which is originated from the electric charge on the portion of the substrate, can be reduced (Second processing method).

As described above, according to the aspects can be provided provide a parallel plate type substrate plasma processing apparatus wherein the RF electrode is disposed opposite to the opposing electrode in a vacuum chamber so as to generate a plasma with an energy suitable for the substrate processing and a smaller ion energy range enough to process the substrate finely. Also, according to the aspects can be provided a substrate plasma processing method utilizing the substrate plasma processing apparatus.

DETAILED DESCRIPTION OF THE INVENTION

Hereinafter, the present invention will be described in detail with reference to the drawings.

In an embodiment, the frequency ωrf/2π of the RF voltage, which is applied to the RF electrode from the pulsed voltage applying device, is set to 50 MHz or over, and the controller of the pulsed voltage applying device is configured so as to control at least a pulse width t1 ($s$) and a voltage value $V_{pulse}$ of the pulsed voltage so that the relation of $t1 \geq 2\pi/(\omega p/5)$ is satisfied (herein, ωp is a plasma ion frequency and represented as $\omega p = (e^2 N_0/\epsilon_0 Mi)^{1/2}$; e: elementary charge, $\epsilon_0$: vacuum dielectric constant, Mi: ion mass (kg), $N_0$: plasma density (m³)), and the relation of $|V_{p-p}| < |V_{pulse}|$ is satisfied (herein, $V_{p-p}$ is a voltage value of the RF voltage). In this case, the first processing method can be conducted simply under good condition.

In another embodiment, the frequency ωrf/2π of the RF voltage, which is applied to the RF electrode from the pulsed voltage applying device, is set to 50 MHz or over, and the controller of the pulsed voltage applying device is configured so as to control at least a pulse width t1 ($s$) and a period t2 of the pulsed voltage so that the relation of $2\pi/\omega rf < t1 < t2 < 2\pi/(\omega p/5)$ is satisfied (herein, ωp is a plasma ion frequency and represented as $\omega p = (e^2 N_0/\epsilon_0 Mi)^{1/2}$; e: elementary charge, $\epsilon_0$: vacuum dielectric constant, Mi: ion mass (kg), $N_0$: plasma density (/m³)). In this case, the second processing method can be conducted simply under good condition.

In these embodiments, the reason of the frequency (ωrf/2π) of the RF voltage to be applied to the RF electrode from the RF applying device being set to 50 MHz or over is that the Vdc (average substrate incident ion energy), originated from the RF voltage, is lowered enough not to affect the substrate processing. Moreover, the reason of the RF voltage being constantly applied to the RF electrode is that the plasma to be used for the substrate processing can be generated effectively and efficiently, thereby realizing the intended substrate processing even though an insulating film is formed on the substrate.

In these aspects, in this point of view, the substrate processing is mainly carried out by the pulsed voltage superimposed with the RF voltage.

The energy difference ΔEi between the lower energy side peak and the higher energy side peak of the ion energy to be incident onto the substrate is decreased as the frequency of the RF voltage is increased. Therefore, if the frequency of the RF voltage is increased, particularly to 50 MHz or over, the lower energy side peak and the higher energy side peak can be shifted in the vicinity of one another so that the energy difference ΔEi can be narrowed. In this case, it is considered that the lower energy side peak is combined with the higher energy side peak, thereby forming one energy peak, so that the intended substrate processing can be carried out by using the ions within an energy range of the combined energy peak.

In an embodiment, the pulsed voltage may be rendered a negative pulsed voltage. Generally, when an intended plasma is generated by means of the application of RF voltage to an RF electrode, the potential of the RF electrode is rendered negative by means of self-bias principle. Therefore, the ions in the vicinity of the RF electrode are affected by the periodical voltage (RF voltage) of which the voltage value is shifted negative, thereby conducting the substrate processing through the collision of the ions against the substrate by utilizing the RF voltage as an accelerating voltage. In this point of view, if the pulsed voltage is rendered a positive pulsed voltage, the RF voltage shifted negative may be partially cancelled by the positive pulsed voltage so that it may be that the positive ions can not be accelerated by the RF voltage.

As a result, if the pulsed voltage may be rendered the negative pulsed voltage, the above-described disadvantage can be removed.

In an embodiment, the controller of the pulsed voltage applying device is configured so as to control a pulse number n1 in continuous application of the pulsed voltage so that the relation of $n1 < \in_0 \in_s /(ZeNivbt1) \times (Vmax/d)$ is satisfied (herein, $\in_0$: vacuum dielectric constant, $\in_s$: relative dielectric constant of trench bottom under processing, Z: ionic valency number, Ni: ion density (/m³), vb: Bohm velocity represented by the equation of kTe/Mi, t1: application period of pulsed voltage, that is, pulse width, d: thickness of bottom dielectric material, Vmax/d: dielectric withstand electric field strength), Te: electron temperature (eV). In this case, the dielectric breakdown at the portion of the substrate, particularly at the bottom of the trench of the substrate under processing can be reduced.

In an embodiment, the controller of the pulsed voltage applying device is configured so as to control a pulse width t1 (s) so that the relation of $t1 < \in_0 \in_s /(ZeNivb) \times (Vmax/d)$ is satisfied (herein, $\in_0$: vacuum dielectric constant, $\in_s$: relative dielectric constant of trench bottom under processing, Z: ionic valency number, vb: Bohm velocity represented by the equation of kTe/Mi, d: thickness of bottom dielectric material, Vmax/d: dielectric withstand electric field strength), Te: electron temperature (eV). In this case, the dielectric breakdown at the portion of the substrate, particularly at the bottom of the trench of the substrate under processing can be reduced.

Herein, the above-described relations are derived as follows. The same reference characters as above-described equations are used throughout the following equations.

First of all, the charge amount on the portion of the substrate, particularly on the bottom of the trench of the substrate can be represented by the following equation:

$Q = S \times ZeNivb$ (t1×ni) (S: area of bottom of trench under processing). Therefore, the capacitance of the bottom portion under processing can be represented by the following equation:

$$C = \in_0 \times S/d.$$

As a result, the voltage to be applied to the bottom portion under processing can be represented by the following equation:

$$V = Q/C = ZeNivb(t1 \times ni) \times d / \in_0 \in_s.$$

Suppose that the maximum voltage so as not to bring about the dielectric breakdown of the bottom portion under processing is defined as "$V_{max}$", it is required that the relation of $V_{max} > V$ is satisfied (V: voltage value of pulsed voltage). In this point of view, if the above-described equation is rewritten on the basis of the pulse number n1 and the pulse width t1, the above-described relations about the pulse number n1 and the pulse width t1 can be obtained.

In an embodiment, the controller of the pulsed voltage applying device is configured so as to control a voltage value $V_{pulse}$ of the pulsed voltage so that the relation of $(v_{therm}/v_{dc})^{1/2} \leq 0.5 L1/L2$ is satisfied (herein, $v_{therm}$: thermal velocity of ion represented by the equation of $(8 kTe/\pi Mi)/2$, vdc= $(2eZ \times V_{pulse}/Mi)^{1/2}$, L: width of trench to be formed, L2: depth of trench to be formed), Te: electron temperature (eV). In this case, the ions can be reached to the bottom of the trench of the substrate under processing with no collision against the side walls of the trench so as to enhance the processing efficiency and promote the fine processing for the trench.

In an embodiment, the controller of the pulsed voltage applying device is configured so as to control a pause period t3 (s) so that the relation of $n1 \times t1 \leq t3$ is satisfied (herein, n1: pulse number in continuous application of pulsed voltage, t1: application period of pulsed voltage, that is, pulse width). In this case, since the pause period of the pulsed voltage is set equal to or longer than the application period of the pulsed voltage, the electric charge on the bottom of the trench under processing can be effectively removed.

Then, an etching end-detecting monitor or a change-detecting monitor may be provided so that at least one of the pulse width t1, the pause period t3 and the voltage value $V_{pulse}$ in the pulsed voltage can be adjusted referring to a monitoring information from the etching end-detecting monitor or the change-detecting monitor. In this case, since the processing information can be obtained instantly, the intended substrate can be processed finely and effectively referring to the processing information.

In the present specification, the "RF applying device" may include an RF generator and an impedance matching box which are known by the person skilled in the art. Moreover, the RF applying device may include an amplifier as occasion demands.

In the present specification, the "pulse applying device" may include an amplifier, a low-pass filter in addition to a pulse generator which is known by the person skilled in the art.

In view of the additional aspects as described above, a substrate plasma processing apparatus and a substrate plasma processing method according to the present invention will be described herein after, in comparison with a conventional substrate plasma processing apparatus and method.

Comparative Embodiment Utilizing a Substrate Plasma Processing Apparatus

Figure 1:
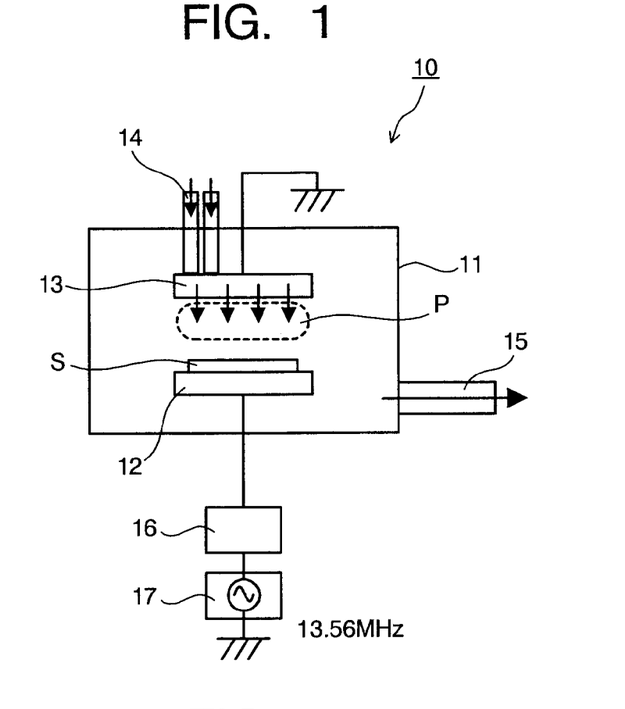
FIG. 1 is a structural view schematically illustrating a conventional substrate plasma processing apparatus (Comparative Embodiment).

FIG. 1 is a structural view schematically illustrating a conventional substrate plasma processing apparatus in Comparative Embodiment.

In a substrate plasma processing apparatus 10 illustrated in FIG. 1, an high frequency (RF) electrode 12 is disposed opposite to an opposing electrode 13 in a vacuum chamber 11 of which the interior is evacuated under a predetermined degree of vacuum. A substrate S to be processed is positioned on the main surface of the RF electrode 12 which is opposite to the opposing electrode 13. As a result, the substrate plasma processing apparatus 10 constitutes a so-called parallel plate type plasma processing apparatus. A gas for generating plasma and thus, processing the substrate S is introduced in the chamber 11 through a gas conduit 14 designated by the arrows. The interior of the chamber 11 is also evacuated by a vacuum pump (not shown) so that the interior of the chamber 11 can be maintained in a predetermined pressure under the vacuum condition. For example, the interior of the chamber 11 may be set to about 1 Pa.

Then, a predetermined RF voltage is applied to the RF electrode 12 from a commercial RF power source 17 to generate a high frequency wave of 13.56 MHz via a matching box 16 so that the intended plasma P can be generated between the RF electrode 12 and the opposing electrode 13.

In this case, since the RF electrode 12 is charged negatively so as to be self-biased negatively (the amplitude of the electric potential: Vdc), the positive ions in the plasma are incident onto the substrate S positioned on the RF electrode 12 at high velocity by means of the negative self-bias of Vdc. As a result, the surface reaction of the substrate S is induced by utilizing the substrate incident energy of the positive ions, thereby conducting an intended plasma substrate processing such as reactive ion etching (RIE), CVD (Chemical vapor Deposition), sputtering, ion implantation. Particularly, in view of the processing for the substrate, the RIE can be mainly employed as the plasma substrate processing. Therefore, the RIE processing will be mainly described hereinafter.

Figure 2:
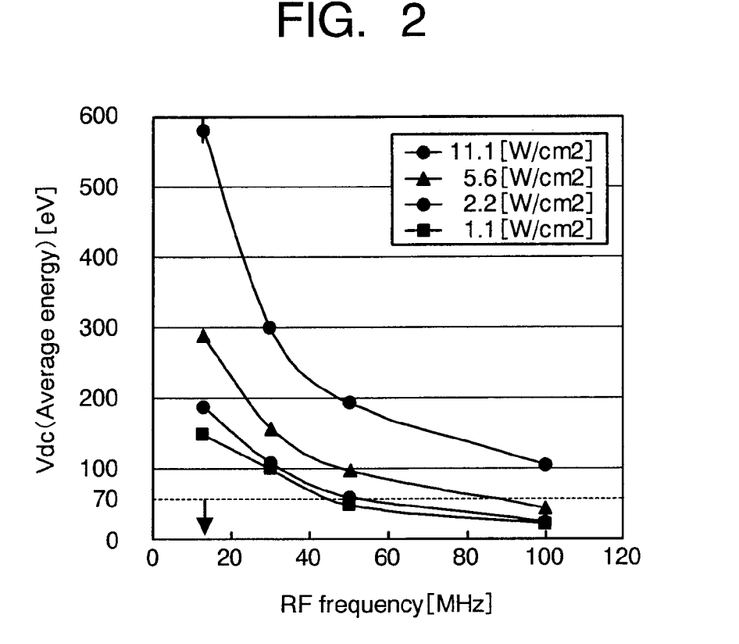
FIG. 2 is a graph showing the relation between the RF power and the Vdc (average substrate incident ion energy) in the conventional apparatus illustrated in FIG. 1.

In the plasma processing apparatus 10 illustrated in FIG. 1, since the Vdc (the average substrate incident energy of the positive ions) is increased as the RF power is increased, as shown in FIG. 2, the RF power is controlled so as to adjust the Vdc for the appropriate processing rate and the shape-forming processing. The Vdc can be adjusted by controlling the pressure in the chamber and the shape of the RF electrode 12 and/or the opposing electrode 13.

Figure 3:
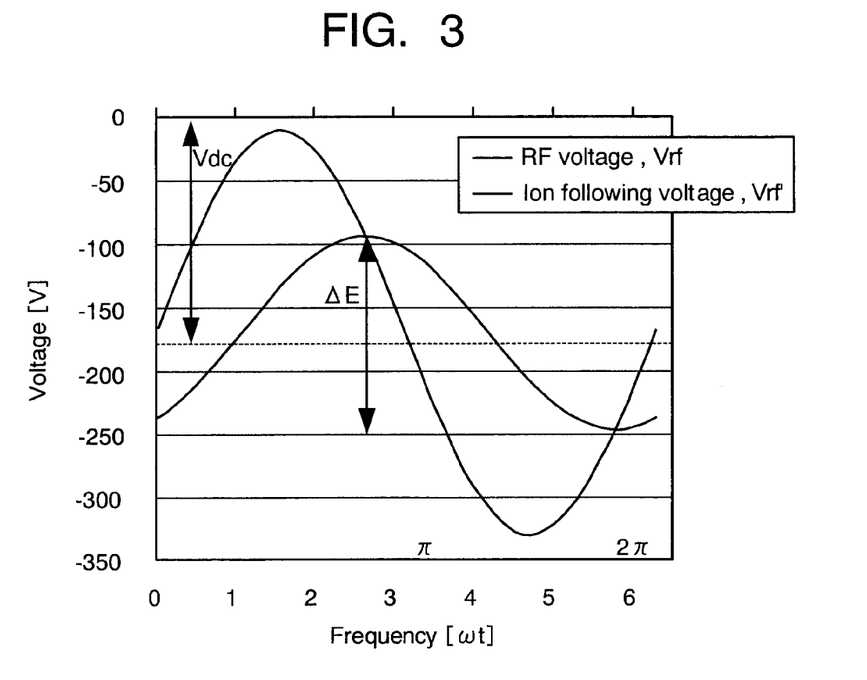
FIG. 3 is a graph representing the characteristics of a plasma originated from the simulation on the basis of the continuum modeled plasma simulator.
Figure 4:
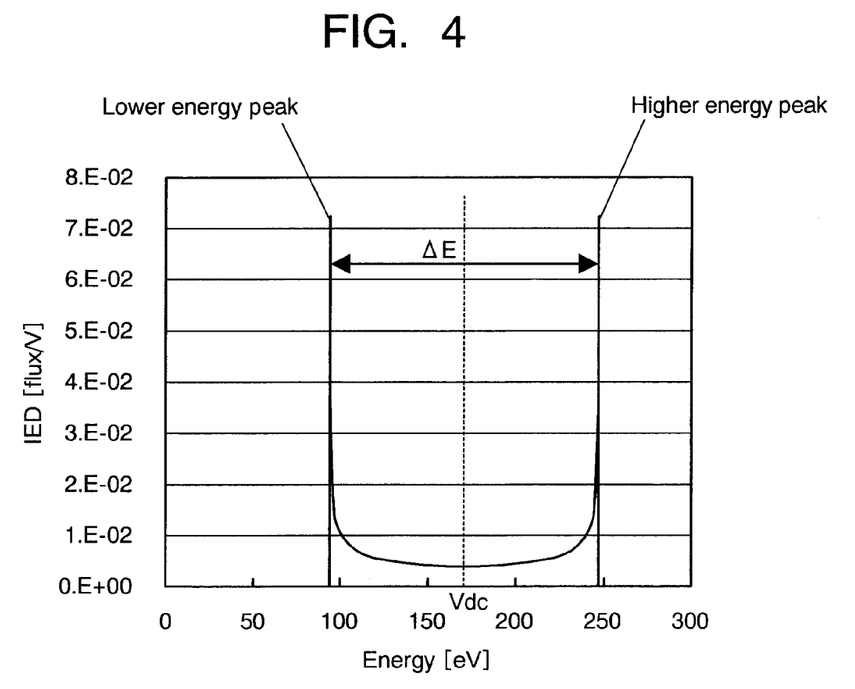
FIG. 4 is a graph representing the energy range distribution of the plasma originated from the simulation on the basis of the continuum modeled plasma simulator.
Figure 5:
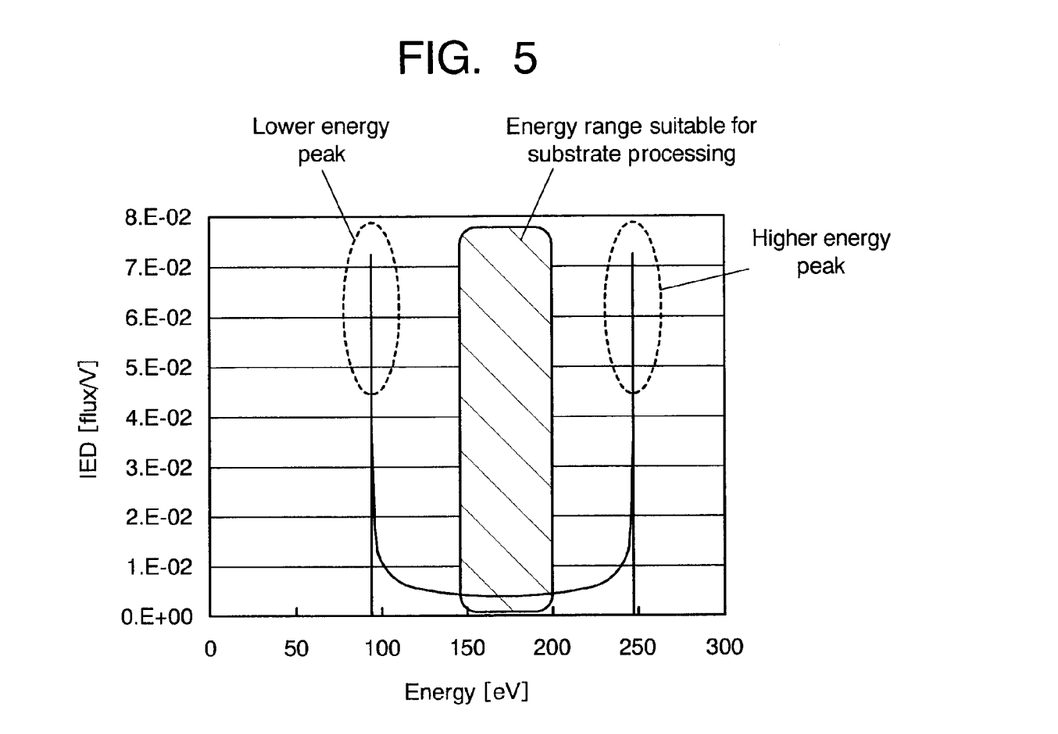
FIG. 5 is a graph showing an ion energy distribution suitable for the substrate processing.

FIGS. 3 and 4 are graphs representing the characteristics of a plasma originated from the simulation on the basis of the continuum modeled plasma simulator (refer to, G. Chen, L. L. Raja, J. Appl. Phys. 96, 6073 (2004)) under the condition that the Ar gas pressure is set to 50 mTorr and the distance between the electrodes is set to 30 mm and the wafer size is set to 300 mm, and the frequency of the high frequency wave is set to 3 MHz and a Vrf of 160 V is employed. FIG. 5 is a graph showing an ion energy distribution suitable for the substrate processing.

As shown in FIG. 3, since the RF electrode potential is periodically varied, the substrate incident ion energy is also periodically varied. However, since the substrate incident ion energy follows the RF electrode potential behind time due to the ion mass, the amplitude Vrf' of the substrate incident ion energy becomes smaller than the amplitude Vrf of the RE electrode potential. The substrate incident ion energy depends properly on the Vdc and the plasma potential Vp, but since the absolute value and time variation of the Vp are extremely small, the detail explanation for the Vp is omitted in the present specification and the depiction of the Vp is omitted in FIG. 3. As a result, the incident ion energy for the substrate S can be represented as in FIG. 4 by integrating the incident ion energy variation shown in FIG. 3 with time.

As is apparent from FIG. 4, the incident ion energy in the plasma generated in the chamber 11 illustrated in FIG. 1 is divided into the lower energy side peak and the higher energy side peak so that the energy difference $\Delta E$ between the peaks can be set within several ten (eV) to several hundred (eV) in dependent on the plasma generating condition. Even though the Vdc is controlled suitable for the intended substrate processing, therefore, with the substrate incident ions, the ions within a higher energy range (higher energy side peak) coexists with the ions within a lower energy range (lower energy side peak), as shown in FIG. 5.

In the plasma substrate processing such as the RIE, in this point of view, the processing shape of the substrate S may be deteriorated because some corners of the substrate S are flawed by the ions with the higher energy. Moreover, if the ions with the lower energy are employed, the substrate processing may not be conducted because the ion energy becomes below the surface reaction threshold energy or the processing shape of the substrate may be also deteriorated due to the reduction in the processing anisotropy which is originated from that the incident angle range of the ions are enlarged by thermal motion of ions.

Embodiment Utilizing a Substrate Plasma Processing Apparatus

Figure 6:
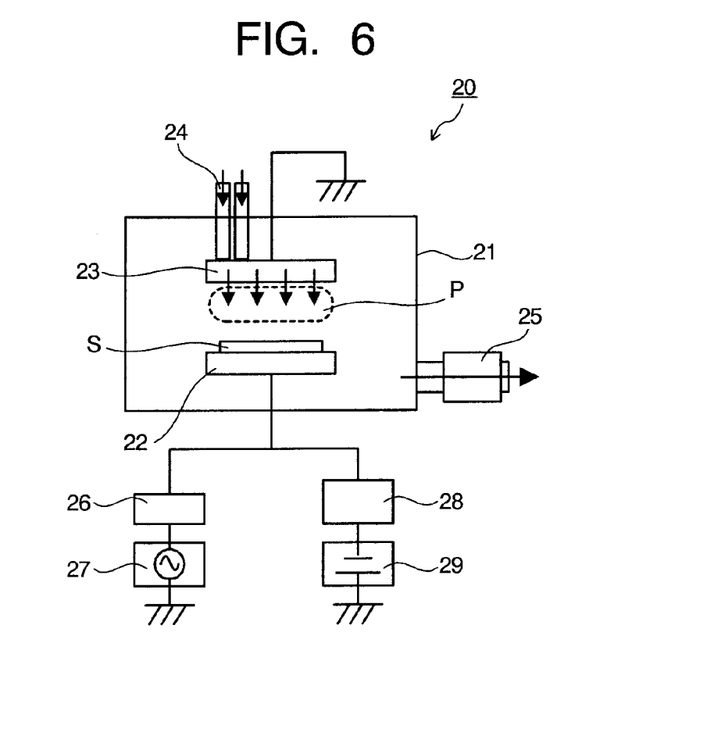
FIG. 6 is a structural view schematically illustrating a substrate plasma processing apparatus according to an embodiment.
Figure 7:
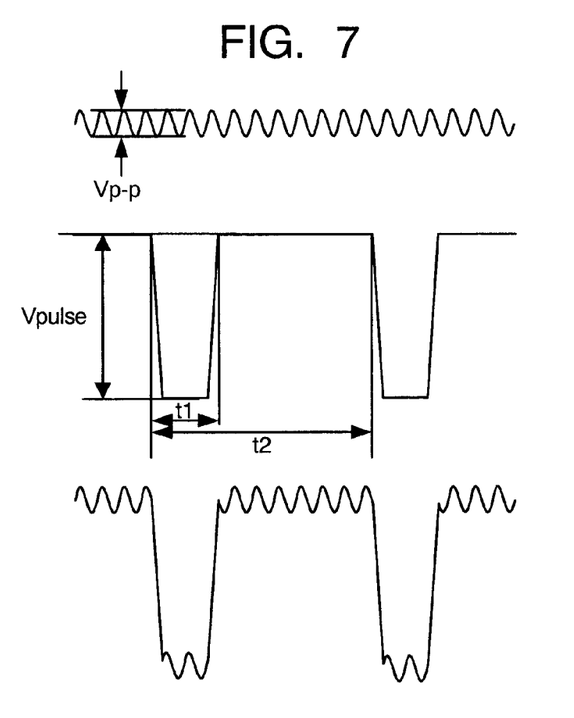
FIG. 7 is a schematic view illustrating the waveform of a superimposed high frequency wave to be applied as a voltage to the RF electrode of the apparatus illustrated in FIG. 6.

FIG. 6 is a structural view schematically illustrating a substrate plasma processing apparatus according to an embodiment. FIG. 7 is a schematic view illustrating the waveform of a superimposed high frequency wave to be applied as a voltage to the RF electrode of the apparatus illustrated in FIG. 6. The RIE processing will be mainly described hereinafter as a plasma processing method utilizing the plasma processing apparatus illustrated in FIG. 6.

In a substrate plasma processing apparatus 20 illustrated in FIG. 6, an high frequency (RF) electrode 22 is disposed opposite to an opposing electrode 23 in a vacuum chamber 21 of which the interior is evacuated under a predetermined degree of vacuum. A substrate S to be processed is positioned on the main surface of the RF electrode 22 which is opposite to the opposing electrode 23. As a result, the substrate plasma processing apparatus 20 constitutes a so-called parallel plate type plasma processing apparatus. A gas for generating plasma and thus, processing the substrate S is introduced in the chamber 21 through the gas conduit 24 designated by the arrows. The interior of the chamber 21 is also evacuated by a vacuum pump (not shown) through an exhaust line 25 so that the interior of the chamber 11 can be maintained in a predetermined pressure under the vacuum condition.

As the gas, such a gas as Ar, Kr, Xe, $N_2$, $O_2$, CO, $H_2$ can be employed, and more, such a processing gas as $SF_6$, $CF_4$, $C_2F_6$, $C_4F_8$, $C_5F_8$, $C_4F_6$, $Cl_2$, HBr, $SiH_4$, $SiF_4$ can be employed. The pressure in the chamber 21 may be appropriately set in accordance with the processing rate for the substrate S and the kind of gas to be used.

Then, an RF voltage is applied to the RF electrode 22 from an RF power source 27 via a matching box 26 while a pulsed voltage is applied to the RF electrode 22 from a pulsed voltage power source 29 via a low-pass filter 28. In this case, the RF voltage and the pulsed voltage are superimposed and thus, applied to the RF electrode 22, as shown in FIG. 7, so that a plasma P can be generated between the RF electrode 22 and the opposing electrode 23. The positive ions in the plasma P is accelerated by the negative self-bias voltage (the average substrate incident ion energy can be represented by "Vdc") of the RF electrode 22, and thus, incident onto the substrate S so as to be processed.

The RF voltage power source 27 and the pulsed voltage power source 29 may include the respective amplifiers to amplify the RF voltage and the pulsed voltage therein.

It is desired that the pulsed voltage can be rendered a negative pulsed voltage. As described above, the positive ions in the plasma P is accelerated at high velocity by the negative self-bias voltage of the RF electrode 22, and thus, incident onto the substrate S so as to be processed. Not particularly shown in FIG. 7, the RF voltage is periodically varied in a negative voltage range due to the self-bias voltage, as shown in FIG. 3. Therefore, if the pulsed voltage is rendered a positive pulsed voltage, the amplitude of the RF voltage may be partially cancelled by the amplitude of the pulsed voltage, so that the intended accelerating voltage can not be generated and thus, the positive ions can not be accelerated sufficiently.

As a result, if the pulsed voltage may be rendered the negative pulsed voltage, the above-described disadvantage can be removed.

Figure 8:
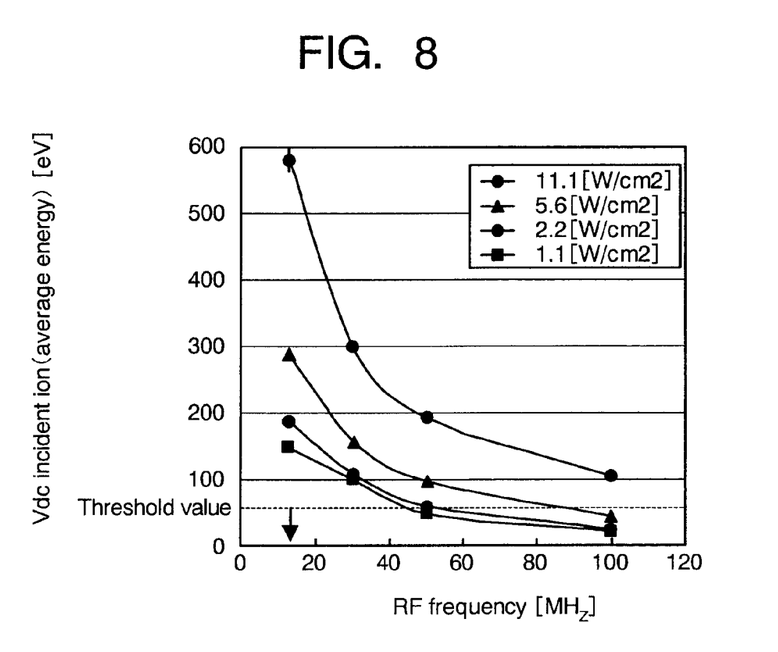
FIG. 8 shows a graph showing the relation between the Vdc (average substrate incident ion energy) and the RF frequency in the apparatus illustrated in FIG. 6.
Figure 9:
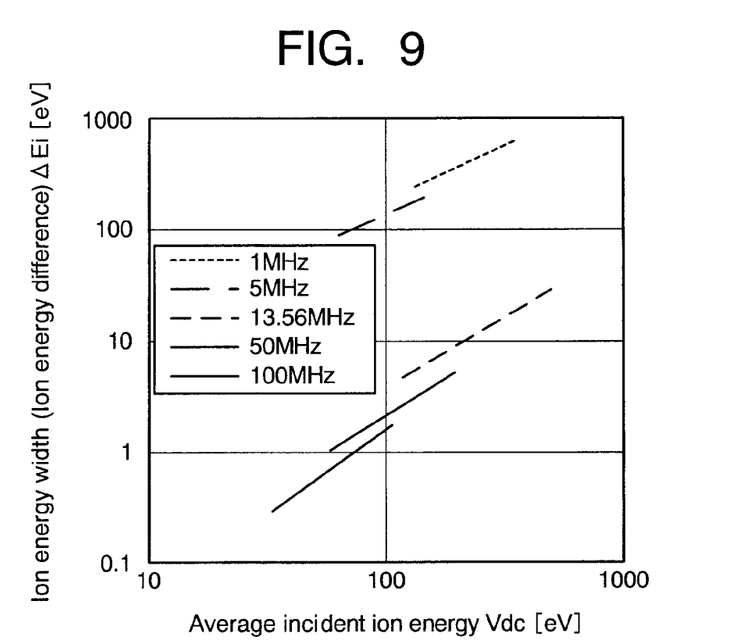
FIG. 9 shows a graph showing the relation between the energy difference ΔEi and the Vdc (average substrate incident ion energy).

FIG. 8 shows a graph showing the relation between the Vdc (average substrate incident ion energy) and the RF frequency in the apparatus illustrated in FIG. 6. FIG. 9 shows a graph showing the relation between the energy difference $\Delta Ei$ and the Vdc (average incident ion energy). The graph shown in FIG. 8 is the same as the graph shown in FIG. 2.

As is apparent from FIG. 8, the Vdc (average substrate incident ion energy) is decreased as the frequency of the RF voltage to be applied to the RF electrode 22 is increased. Particularly, if the RF power is set to 2.2 W/cm² or below, the RF power is decreased to about a threshold value of 50 eV or below which can not affect the substrate processing when the frequency of the RF voltage is increased to 50 MHz or over. Moreover, if the RF power is set beyond 2.2 W/cm$^2$, the dependency of the Vdc on the frequency of the RF power becomes extremely small when the frequency of the RF voltage is increased beyond 50 MHz. If the frequency of the RF voltage is set to 50 MHz or over, therefore, it is apparent that the RF voltage can not affect the substrate processing, but only the (negative) pulsed voltage can affect the substrate processing.

In other words, since the substrate processing can be carried out by controlling the (negative) pulsed voltage, the operation for the substrate processing can be simplified so that the operationality of the substrate processing can be developed.

In this embodiment, the constant application of the RF voltage to the RF electrode is directed mainly at the effective and efficient plasma generation and thus, conducting the substrate processing even though an insulating film is formed on the substrate S.

As is apparent from FIG. 9, the energy difference ΔEi between the higher energy side peak and the lower energy side peak as shown in FIG. 4 is decreased as the frequency of the RF voltage is increased under the same Vdc condition. As a result, it is advantage to increase the frequency of the RF voltage, e.g., to 50 MHz or over because the lower energy side peak and the higher energy side peak can be shifted in the vicinity of one another so that the energy difference ΔEi can be narrowed. In this case, it is considered that the lower energy side peak is combined with the higher energy side peak, thereby forming one energy peak, so that the intended substrate processing can be carried out by using the ions within an energy range of the combined energy peak.

With a controller (not shown) built in the pulsed voltage power source 29, the pulse width t1 ($s$) and the pulse voltage value $V_{pulse}$ (V) of the pulsed voltage generated from the pulsed voltage power source 29 are controlled so that the relation of t1≧2π/(ωp/5) is satisfied (herein, ωp is a plasma ion angular frequency and represented as ωp=(e$^2$N$_0$/∈$_0$Mi)$^{1/2}$; e: elementary charge, ∈$_0$: vacuum dielectric constant, Mi: ion mass (kg), N$_0$: plasma density (/m$^3$), and the relation of $|V_{p-p}|<|V_{pulse}|$ is satisfied (herein, $V_{p-p}$ is a voltage value of the RF voltage).

In this case, since the positive ions can follow the pulsed voltage, the lower energy side peak can be shifted within an energy range small enough not to affect the substrate processing when the ion energy variation is integrated with time, thereby obtaining the ion energy distribution as shown in FIG. 4. Therefore, if the energy range of the higher energy side peak is controlled suitable for the substrate processing, the intended substrate processing can be carried out by using the ions within the higher energy side peak. In other words, if the inherent narrowed energy range of the higher energy side peak is utilized and controlled suitable for the substrate processing, the fine substrate processing can be carried out only by using the ions within the higher energy side peak (First processing method).

Herein, the (absolute) energy value of the higher energy side peak can be controlled by the pulse voltage value $V_{pulse}$ of the pulsed voltage.

With a controller (not shown) built in the pulsed voltage power source 29, the pulse width t1 ($s$) and the period t2 ($s$) of the pulsed voltage generated from the pulsed voltage power source 29 are controlled so that the relation of 2π/ωrf<t1<t2<2π/(ωp/5) is satisfied (herein, ωp is a plasma ion angular frequency and represented as ωp=(e$^2$N$_0$/∈$_0$Mi)$^{1/2}$; e: elementary charge, ∈$_0$: vacuum dielectric constant, Mi: ion mass (kg), N$_0$: plasma density (/m$^3$)).

In this case, since the positive ions can not follow the pulsed voltage, the lower energy side peak and the higher energy side peak can be shifted in the vicinity of one another so that the energy difference ΔEi can be narrowed when the ion energy variation is integrated with time, thereby obtaining the ion energy distribution as shown in FIG. 4. Therefore, it is considered that the lower energy side peak is combined with the higher energy side peak, thereby forming one energy peak. Namely, if the lower energy side peak is located in the vicinity of the high energy side peak, the lower energy side peak and the higher energy side peak can be defined as one energy peak with the corresponding narrow energy range width.

As a result, if the energy range of the thus obtained combined energy peak, and the vicinity between the lower energy side peak and the higher energy side peak, i.e., the narrowing degree of the combined energy peak are optimized, the substrate processing can be conducted finely by using the ions within the combined energy peak (Second processing method). Herein, the (absolute) energy value of the combined energy side peak can be controlled by the pulse voltage value $V_{pulse}$ and/or duty ratio of the pulsed voltage.

In both of the first processing method and the second processing method, if the pulsed voltage (with the RF voltage) is continuously applied to the substrate S for the continuous processing for the substrate S, the processing portion, that is, the trench under processing of the substrate S is charged positively. Particularly, the bottom of the trench is likely to be charged. As a result, when the ions are incident into the trench, the ions are deflected by the coulomb force originated from the positive charge on the bottom of the trench so as not to be reached to the bottom of the trench. Accordingly, the trench can not be processed in high aspect ratio. Moreover, if the charge amount on the bottom of the trench is increased, dielectric breakdown may occur from the bottom of the trench.

In this point of view, when the substrate S is processed to form the trench thereat, it is desired that the application of the pulsed voltage is paused after a predetermined period of time. In this case, the electric charge on the bottom of the trench can be reduced effectively so as to remove the problems as described above. In a pause period ion with lower energy by high frequency RF reduce the electric negative charge on the upper side wall of the trench and therefore the electric positive charge on the bottom of the trench is reduced by electron.

Figure 10:
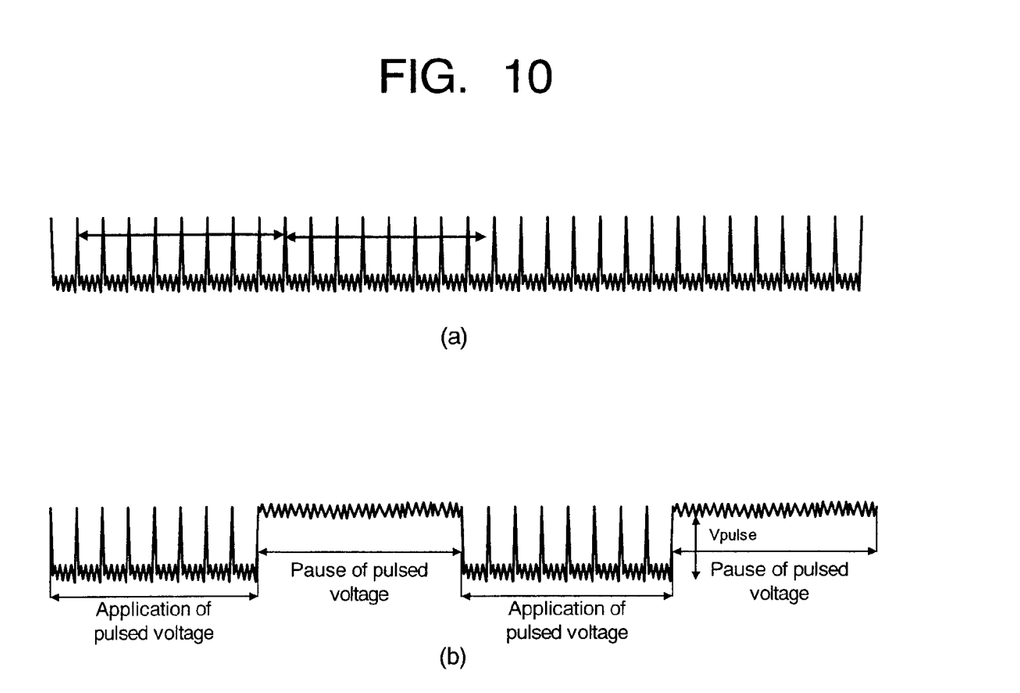
FIG. 10 shows a conceptual graph relating to the voltage applying profile with time in the substrate processing.
Figure 11:
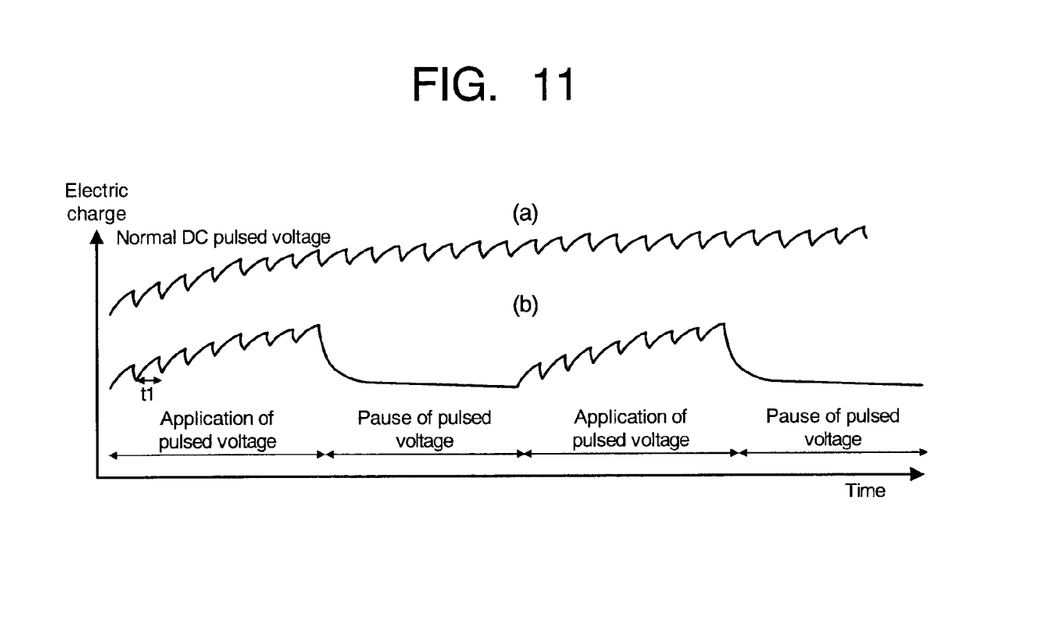
FIG. 11 shows a conceptual graph relating to the electrostatic charge of the trench of the substrate under processing in accordance with the voltage applying profile in FIG. 10.

FIG. 10 is a graph conceptually showing the voltage application profile with time when the application of the pulsed voltage is paused. FIG. 11 is a graph conceptually showing the state of the electric charge at the trench bottom of the substrate S under processing. In both of FIGS. 10 and 11, the graphs designated by the reference character "a" shows the continuous application of the pulsed voltage without pause and the graphs designated by the reference character "b" shows the intermittent application of the pulsed voltage with pause.

As shown in FIG. 10($b$), in the embodiments relating to the first processing method and the second processing method, the application of the pulsed voltage is paused after a predetermined period of time. As shown in FIG. 11($b$), in these cases, the charge amount on the bottom of the trench under processing is increased almost linearly during the application of the pulsed voltage. In contrast, the charge amount on the bottom of the trench under processing is decreased remarkably during the pause (t3) of the pulsed voltage because the electric charge of the trench is neutralized. Therefore, the electric charge on the bottom of the trench can be effectively reduced so that the deterioration of the processing accuracy and the dielectric breakdown in the substrate S (trench) can be prevented.

On the other hand, as shown in FIG. 10(*a*), if the pulsed voltage is continuously applied without pause, the charge amount on the bottom of the trench under processing is almost linearly increased as shown in FIG. 11(*a*). Therefore, if the ions are incident into the trench, the ions can not be reached to the bottom of the trench due to the coulomb force originated from the electric charge so as not to process the trench finely so that the dielectric breakdown may occur at the bottom of the trench.

In order to prevent the dielectric breakdown of the bottom of the trench under processing effectively, the pulse number n1 in the continuous application of the pulsed voltage is defined so as to satisfy the relation of $n1 < \epsilon_0 \epsilon_s/(ZeNivbt1) \times (Vmax/d)$ by means of the controller built in the pulsed power supply 29 (herein, $\epsilon_0$: vacuum dielectric constant, $\epsilon_s$: relative dielectric constant of trench bottom under processing, Z: ionic valency number, Ni: ion density ($/m^3$), vb: Bohm velocity represented by the equation of kTe/Mi, t1: application period of pulsed voltage, that is, pulse width, d: thickness of bottom dielectric material, Vmax/d: dielectric withstand electric field strength), Te: electron temperature (eV). Similarly, the application period (pulse width) t1 of the pulsed voltage is defined so as to satisfy the relation of $t1 < \epsilon_0 \epsilon_s/(ZeNivb) \times (Vmax/d)$ by means of the controller built in the pulsed power supply 29 (herein, $\epsilon_0$: vacuum dielectric constant, $\epsilon s$: relative dielectric constant of trench bottom under processing, Z: ionic valency number, Ni: ion density ($/m^3$), vb: Bohm velocity represented by the equation of kTe/Mi, d: thickness of bottom dielectric material, Vmax/d: dielectric withstand electric field strength), Te: electron temperature (eV).

The above-described relations are derived in view of the maximum voltage designated by "Vmax" so as not to bring about the dielectric breakdown at the trench of the substrate S under processing originated from the electric charge thereat. The derivation process of the relations is already described above.

Figure 12:
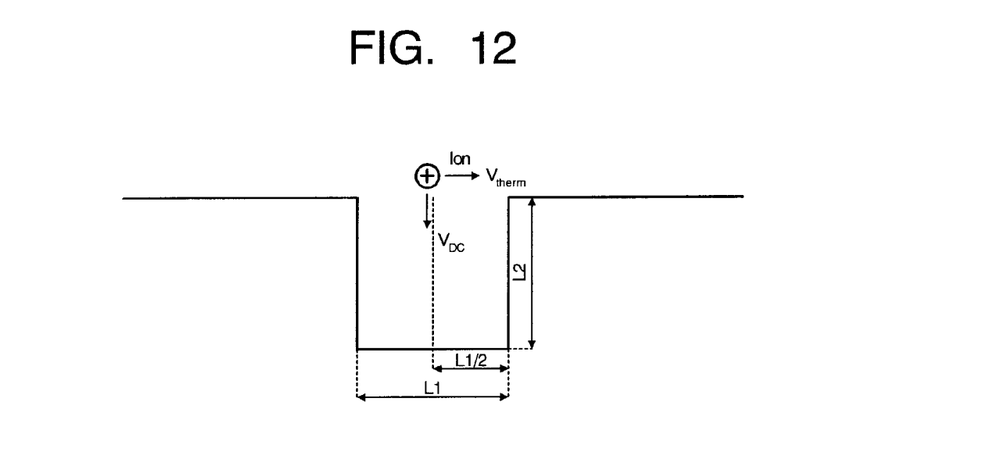
FIG. 12 is a cross sectional view schematically showing the shape of the trench of the substrate under processing.

In order that the ions can be reached to the bottom of the trench with no collision against the side walls of the trench so as to enhance the processing efficiency and promote the fine processing for the trench, the voltage $V_{pulse}$ (V) of the pulsed voltage is controlled so as to satisfy the relation of $(V_{therm}/V_{dc})^{1/2} \leq 0.5 L1/L2$ (herein, $V_{therm}$: thermal velocity of ion represented by the equation of $(8 kTe/\pi Mi)/2$, Vdc=$(2 eZ \times V_{pulse}/Mi)^{1/2}$, L1: width of trench to be formed, L2: depth of trench to be formed), Te: electron temperature (eV). The relation is derived from the trench shape as shown in FIG. 12.

Moreover, it is desired that the pause period t3 of the pulsed voltage after the continuous application can satisfy the relation of $n1 \times t1 \leq t3$. In this case, since the pause period of the pulsed voltage is set equal to or longer than the application period of the pulsed voltage, the electric charge on the bottom of the trench under processing can be effectively removed.

With the plasma etching, e.g., for silicon substrate, a relative large ion energy of about 200 eV is required so as to remove the surface naturally oxidized film, and then, a relatively small ion energy of about 100 eV is preferably required so as to realize the etching process, and then, a much smaller ion energy of about 70 eV is preferably required so as to realize the fine etching process after the stopper such as oxide film is exposed. Such a stepwise ion energy switching can be performed by varying at least one of the pulse width t1, the period t2 and the amplitude of the negative pulsed voltage value $V_{pulse}$.

In the application of the pulsed voltage, a periodical electric charge and discharge process is conducted in the pulsed voltage power source so that the period of the pulsed voltage can not be increased beyond the electric charge duration and the duty ratio of the pulsed voltage has difficulty in being set to 0.5 or over. In this case, at least two pulsed voltage power sources are prepared so as to be connected with one another via a trigger so that the pulsed voltages can be superimposed under the condition that the phases of the pulsed voltages can be shifted from one another. As a result, the period of the resultant superimposed pulsed voltage can be increased beyond the electric charge duration and the duty ratio of the resultant superimposed pulsed voltage can be set to 0.5 or over, which can not be realized by the use of one pulsed voltage power source as described above.

Moreover, if the voltage values $V_{pulse}$ of the pulsed voltages from the pulsed voltage power sources are varied, respectively, the pulsed voltage $V_{pulse}$ of the superimposed pulsed voltage can be rendered stepwise.

Figure 13:
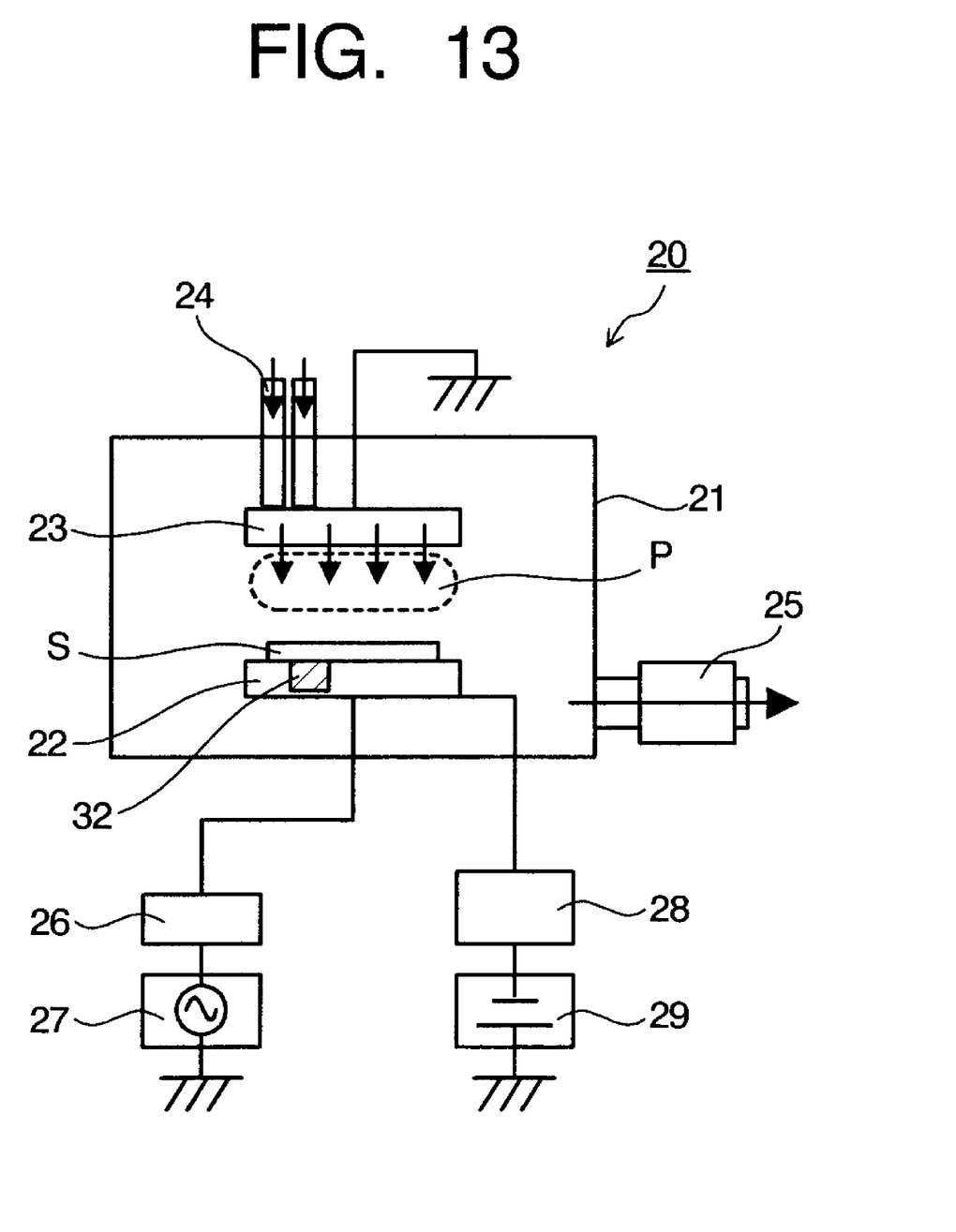
FIG. 13 is a structural view illustrating a modified substrate plasma processing apparatus from the one illustrated in FIG. 6.

FIG. 13 is a structural view illustrating a modified substrate plasma processing apparatuses from the one illustrated in FIG. 6. The plasma processing apparatus illustrated in FIG. 13 is different from the one illustrated in FIG. 6 in that an etching end-detecting monitor or a change-detecting monitor 32 is provided in the RF electrode 22. In this case, since at least one of the application period (pulse width) t1 of the pulsed voltage, the pause period t3 of the pulsed voltage and the voltage value $V_{pulse}$ can be appropriately adjusted referring to the processing condition of the substrate S, the substrate S (trench) can be processed finely and effectively.

The processing condition of the substrate S can be monitored by detecting the resistance or the like of the substrate S.

EXAMPLES

The present invention will be concretely described with reference to Example, but the present invention is not limited to Example. Hereinafter, the concrete results are originated from a predetermined simulation.

Example 1

In Example, the concrete operational characteristics relating to the plasma processing apparatus illustrated in FIG. 6 were investigated.

First of all, a $C_4F_8$ gas and an oxygen gas were introduced in the chamber 21 so that the interior of the chamber 21 was set to a pressure within a range of 2 to 200 mTorr. Then, the RF voltage with the voltage value $V_{p-p}$ of 80 V and the frequency of 100 MHz was applied to the RF electrode 22 from the RF power source 27 while the negative pulsed voltage with the voltage value of −500 V and the frequency of 10 MHz was applied to the RF electrode 22 from the pulsed voltage power source 29 so that the RF voltage was super imposed with the pulsed voltage. Since the plasma density $N_0$ of CF ion was $5 \times 10^{16}$ ($/m^3$), the value of $(\omega p/2)/2\pi$ was about 1.7 MHz. Therefore, since the relation of $2\pi/\omega rf < t1 < t2 < 2\pi/(\omega p/5)$ was satisfied for the pulse width t1 and the period t2 of the pulsed voltage, the CF ions were not also able to follow the pulsed voltage in addition to the RF voltage.

Figure 14:
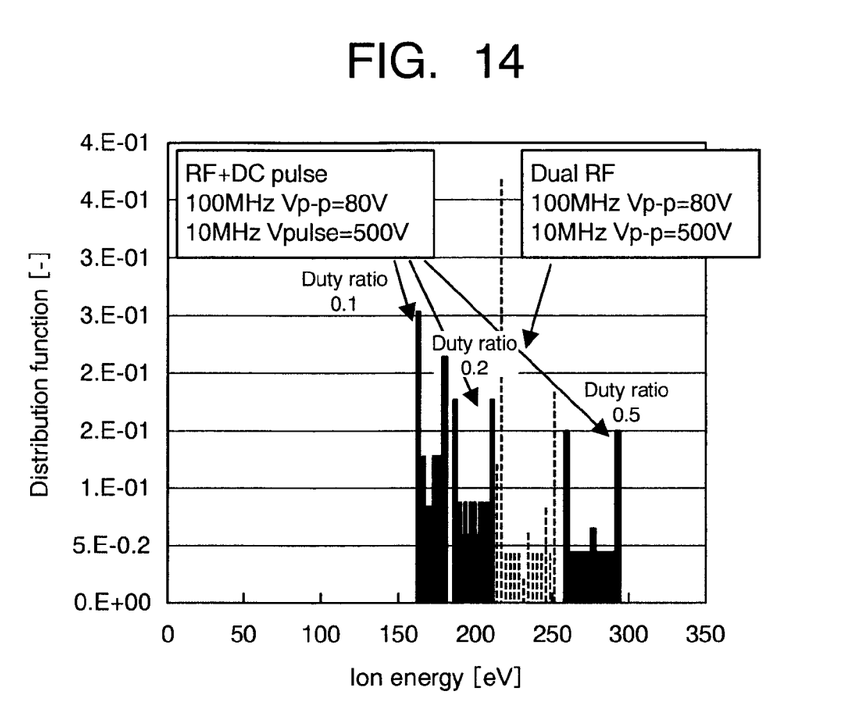
FIG. 14 is a graph showing an ion energy distribution in Examples.
Figure 15:
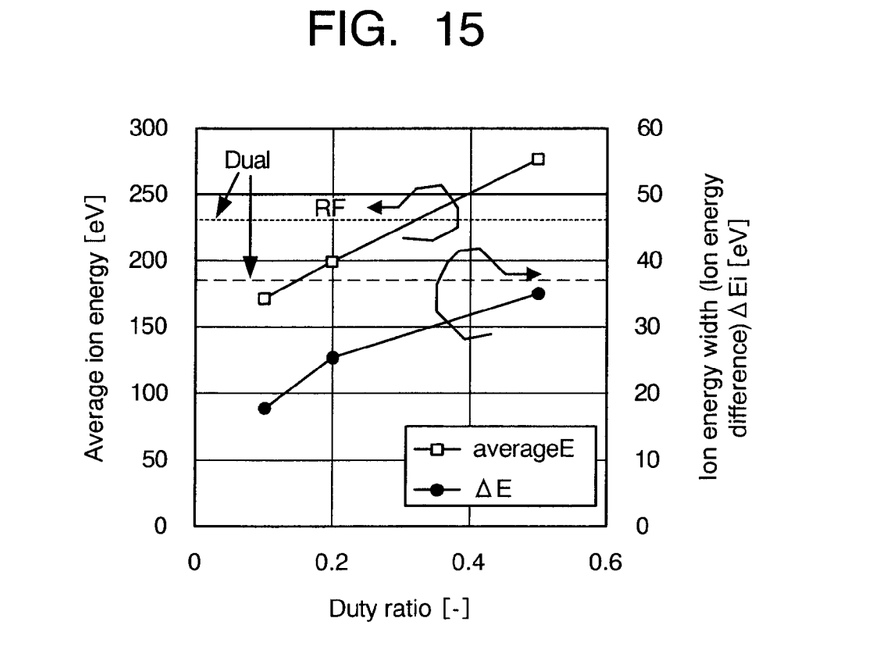
FIG. 15 is a graph showing the relation between the duty ratio of the pulsed voltage and the Vdc (average substrate incident ion energy) in Examples.

As shown in FIGS. 14 and 15, therefore, the resultant ion energy distribution can be narrowed in the case of the application of the negative pulsed voltage than in the case of the application of two RF voltages (dual application of RF voltage). Particularly, the resultant ion energy distribution can be more narrowed as the duty ratio (=t1/t2) of the pulsed voltage is decreased. That is, if the duty ratio is varied, the average ion energy almost proportion to the duty ratio can be also controlled and thus, varied. If the voltage value $V_{pulse}$ of the pulsed voltage is varied, as occasion demands, in the combination with the duty ratio, the average ion energy can be also controlled and thus, varied so as to vary (narrow) the ion energy distribution.

The voltage at the bottom of the trench under processing was about 50 (V). Generally, if the voltage to be applied to the bottom of the trench is beyond about 200 (V), the dielectric breakdown may occur at the bottom thereof. In this Example, however, since the voltage to be applied to the bottom of the trench is decreased to about 50(v), the intended trench can be processed finely with no dielectric breakdown.

Example 2

In Example, the concrete operational characteristics relating to the plasma processing apparatus illustrated in FIG. 6 were also investigated.

In this Example, the RF voltage with the voltage value $V_{p-p}$ of 80 V and the frequency of 100 MHz was applied to the RF electrode 22 from the RF power source 27 while the negative pulsed voltage with the voltage value of −250 V and the frequency of 1 MHz was applied to the RF electrode 22 from the pulsed voltage power source 29 so that the RF voltage was superimposed with the pulsed voltage. Then, the other conditions were set as defined in Example 1.

Figure 16:
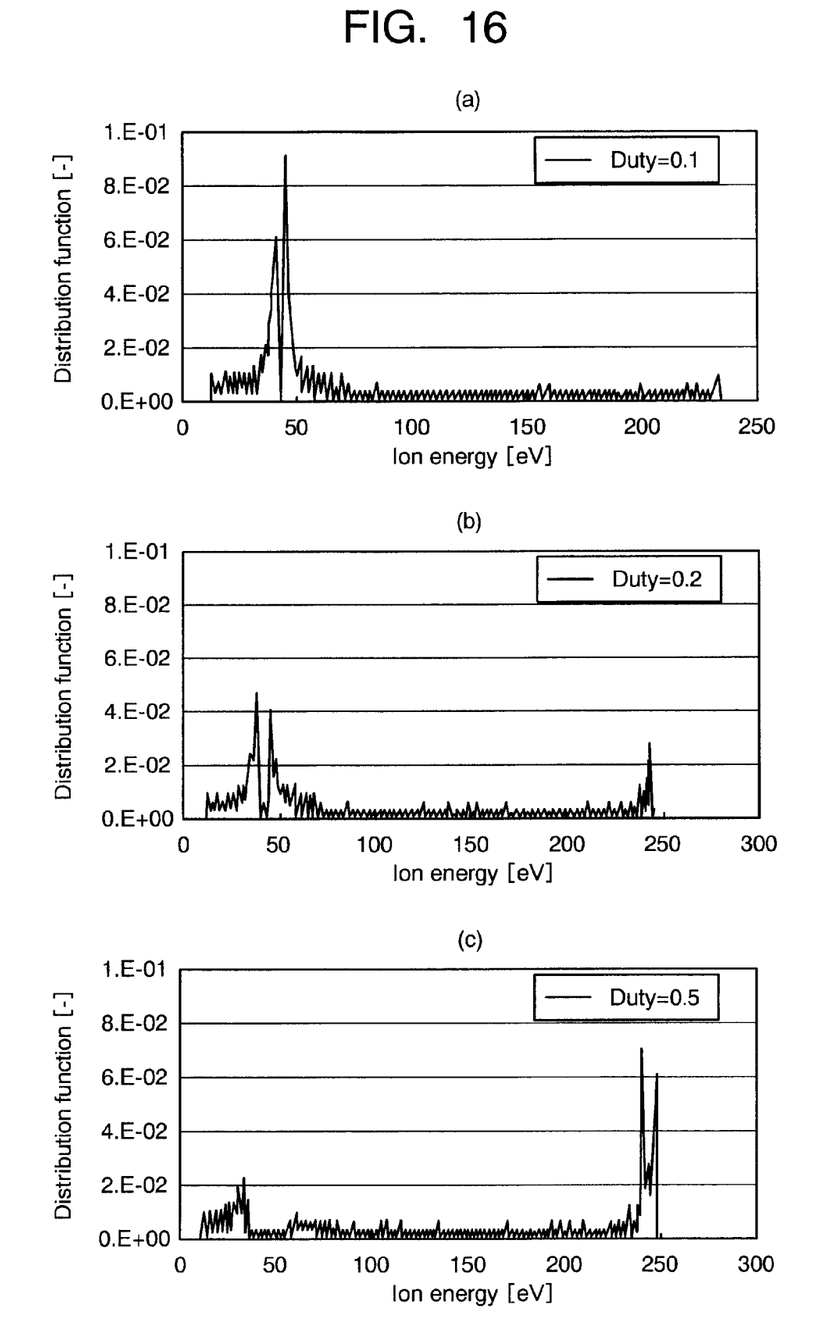
FIG. 16 shows graphs about other ion energy distributions in Examples.

In this Example, since the relation of $t1 \geq 2\pi/(\omega p/5)$ is satisfied, the CF ions can follow the pulsed voltage. As shown in FIG. 16, therefore, the lower energy side peak coexists with the higher energy side peak via a larger energy difference. As shown in FIG. 16, if the duty ratio of the pulsed voltage is increased, the energy distribution density in the higher energy side peak can be increased under the condition that the lower energy side peak coexists with the higher energy side peak via the same energy difference.

The energy value of the higher energy side peak can be adjusted by controlling the voltage value $V_{pulse}$ of the pulsed voltage.

In this Example, since the energy range of the higher energy side peak is narrowed to 8 (eV), the intended fine processing can be realized by using the ions within the energy range.

The voltage at the bottom of the trench under processing was about 50 (V). Generally, if the voltage to be applied to the bottom of the trench is beyond about 200 (V), the dielectric breakdown may occur at the bottom thereof. In this Example, however, since the voltage to be applied to the bottom of the trench is decreased to about 50(v), the intended trench can be processed finely with no dielectric breakdown.

Although the present invention was described in detail with reference to the above examples, this invention is not limited to the above disclosure and every kind of variation and modification may be made without departing from the scope of the present invention.

In these embodiments, for example, the plasma processing apparatus and method of the present invention is directed mainly at RIE technique, but may be applied for another processing technique.

What is claimed is:

1. A method for plasma-processing a substrate, comprising:
    holding said substrate on a main surface of an RF electrode, said RF electrode being disposed opposite to an opposing electrode in a chamber, an interior of said chamber being evacuated under a predetermined vacuum condition;
    applying an RF voltage with a predetermined frequency only to said RF electrode such that said RF electrode is self-biased negatively;
    applying a pulsed voltage to said RF electrode such that said pulsed voltage is superimposed with said RF voltage; and
    controlling a timing of applying said pulsed voltage and defining a pause period of said pulsed voltage; and
    controlling a pulse width t1 (s) so that the relation of $t1 < ((\in_0 \times \in_s)/(Z \times e \times Ni \times vb)) \times (Vmax/d)$ is satisfied (herein, $\in_0$: vacuum dielectric constant, $\in_s$: relative dielectric constant of trench bottom under processing, Z: ionic valency number, Ni: ion density (/m$^3$), vb: Bohm velocity represented by the equation of $(k \times Te)/Mi$, d: thickness of bottom dielectric material, Vmax/d: dielectric withstand electric field strength, Te: electron temperature (eV)).

2. The method as set forth in claim 1, wherein said pulsed voltage is set to a negative pulsed voltage.

3. The method as set forth in claim 1, further comprising:
    setting a frequency $\omega rf/2\pi$ of said RF voltage to 50 MHz or over; and
    controlling at least a pulse width t1 (s) and a voltage value $V_{pulse}$ of said pulsed voltage so that the relation of $t1 \geq (2\pi/(\omega p/5))$ is satisfied (herein, $\omega p$ is a plasma ion frequency and represented as $\omega p = (e^2 N_0/\in_0/\in_0 Mi)^{1/2}$; e: elementary charge, $\in_0$: vacuum dielectric constant, Mi: ion mass (kg), $N_0$: plasma density (/m$^3$)), and the relation of $|V_{p-p}| < |V_{pulse}|$ is satisfied (herein, $V_{p-p}$ is a voltage value of the RF voltage),
    wherein a higher energy side peak of ions incident onto said substrate is adjusted within an energy range for an intended substrate processing.

4. The method as set forth in claim 1, further comprising:
    setting a frequency $\omega rf/2\pi$ of said RF voltage, which is applied to said RF electrode from a pulsed voltage applying device, to 50 MHz or over; and
    controlling at least a pulse width t1 (s) and a period t2 (s) of said pulsed voltage so that the relation of $(2\pi/\omega r \times f) < t1 < t2 < (2\pi/(\omega p/5))$ is satisfied (herein, $\omega p$ is a plasma ion frequency and represented as $\omega p = (e^2 \times N_0/\in_0 \times Mi)^{1/2}$; e: elementary charge, $\in_0$: vacuum dielectric constant, Mi: ion mass (kg), $N_0$: plasma density (/m$^3$)),
    wherein an average ion energy of ions incident onto said substrate is adjusted within an energy range for an intended substrate processing.

5. The method as set forth in claim 1, further comprising:
    controlling a pulse number n1 in a continuous application of said pulsed voltage so that the relation of $n1 < \in_0 \times \in_s/(Z \times e \times Ni \times vb \times t1) \times (Vmax/d)$ is satisfied (herein, $\in_0$: vacuum dielectric constant, $\in_s$: relative dielectric constant of trench bottom under processing, Z: ionic valency number, Ni: ion density (/m$^3$), vb: Bohm velocity represented by the equation of $k \times Te/Mi$, t1: application period of pulsed voltage, that is, pulse width, d: thickness of bottom dielectric material, Vmax/d: dielectric withstand electric field strength, Te: electron temperature (eV)).

6. The method as set forth in claim 1, further comprising:
    controlling a pause period t3 (s) so that the relation of $n1 \times t1 \leq t3$ is satisfied (herein, n1: pulse number in continuous application of pulsed voltage, t1: application period of pulsed voltage, that is, pulse width).

7. The method as set forth in claim 1, further comprising:
    detecting an etching end or a change of the substrate so that at least one of said pulse width t1 (s), a pause period t3 (s)

and a voltage value $V_{pulse}$ in said pulsed voltage can be adjusted referring to the thus obtained detecting information.

8. The method as set forth in claim 1,
wherein said pulsed voltage is constituted of a plurality of pulsed voltages which are superimposed with one another by shifting the corresponding phases.

9. A method for plasma-processing a substrate, comprising:
holding said substrate on a main surface of an RF electrode, said RF electrode being disposed opposite to an opposing electrode in a chamber, an interior of said chamber being evacuated under a predetermined vacuum condition;
applying an RF voltage with a predetermined frequency only to said RF electrode such that said RF electrode is self-biased negatively;
applying a pulsed voltage to said RF electrode such that said pulsed voltage is superimposed with said RF voltage; and
controlling a timing of applying said pulsed voltage and defining a pause period of said pulsed voltage; and
controlling a voltage value $V_{pulse}$ of said pulsed voltage so that the relation of $(V_{therm}/V_{dc})^{1/2} \leq 0.5 L1/L2$ is satisfied (herein, $V_{therm}$: thermal velocity of ion represented by the equation of $(8k \times Te/\pi Mi)/2$, $Vdc = (2e \times Z \times V_{pulse}/Mi)^{1/2}$, L1: width of trench to be formed, L2: depth of trench to be formed, Te: electron temperature (eV)).

\* \* \* \* \*